(12) United States Patent
Shirotori et al.

(10) Patent No.: US 9,985,201 B2
(45) Date of Patent: May 29, 2018

(54) MAGNETIC MEMORY BASED ON SPIN HALL EFFECT

(71) Applicant: Kabushiki Kaisha Toshiba, Minato-ku (JP)

(72) Inventors: Satoshi Shirotori, Yokohama (JP); Hiroaki Yoda, Kawasaki (JP); Yuichi Ohsawa, Yokohama (JP); Yuuzo Kamiguchi, Yokohama (JP); Naoharu Shimomura, Meguro (JP); Tadaomi Daibou, Yokohama (JP); Tomoaki Inokuchi, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days. days.

(21) Appl. No.: 15/451,673

(22) Filed: Mar. 7, 2017

(65) Prior Publication Data

US 2017/0179379 A1  Jun. 22, 2017

Related U.S. Application Data

(63) Continuation of application No. 15/262,139, filed on Sep. 12, 2016, now Pat. No. 9,916,882.

(30) Foreign Application Priority Data

Sep. 14, 2015  (JP) .................................. 2015-181175

(51) Int. Cl.
*G11C 13/00* (2006.01)
*H01L 43/08* (2006.01)
(Continued)

(52) U.S. Cl.
CPC ............ *H01L 43/08* (2013.01); *G11C 11/161* (2013.01); *G11C 11/1673* (2013.01);
(Continued)

(58) Field of Classification Search
CPC ... G11C 11/161; G11C 11/1675; H01L 43/10; H01L 43/08; H01L 23/528
(Continued)

(56) References Cited

U.S. PATENT DOCUMENTS 7,050,275 B2   5/2006   Hasegawa et al.
7,238,540 B2   7/2007   Honjo et al.
(Continued)

FOREIGN PATENT DOCUMENTS

JP   2002-280641   9/2002
JP   2003-282837   10/2003
(Continued)

OTHER PUBLICATIONS

Japanese Office Action dated Jul. 5, 2016 in Japanese Patent Application No. 2015-181175 (with English Translation).

*Primary Examiner* — Richard Elms
*Assistant Examiner* — Xiaochun L Chen
(74) *Attorney, Agent, or Firm* — Oblon, McClelland, Maier & Neustadt, L.L.P.

(57) ABSTRACT

A magnetic memory of an embodiment includes: a first to third terminals; a magnetoresistive element including a first magnetic layer, a second magnetic layer, and a first nonmagnetic layer; a second nonmagnetic layer including a first to third portions, the first portion being located between the second and the third portions, the second and third portions being electrically connected to the second and third terminals respectively, the first magnetic layer being disposed between the first portion and the first nonmagnetic layer; and a third nonmagnetic layer including a fourth to sixth portions, the fourth portion being located between the first portion and the first magnetic layer, the fifth portion including a first region extending from the magnetoresistive element to the second terminal, the sixth portion including a
(Continued)

second region extending from the magnetoresistive element to the third terminal.

25 Claims, 6 Drawing Sheets

(51) Int. Cl.
  *H01L 43/02* (2006.01)
  *G11C 11/16* (2006.01)
  *H01L 27/22* (2006.01)
  *H01L 43/10* (2006.01)
(52) U.S. Cl.
  CPC ........ *G11C 11/1675* (2013.01); *H01L 27/228* (2013.01); *H01L 43/02* (2013.01); *H01L 43/10* (2013.01)
(58) Field of Classification Search
  USPC .......................................... 365/157
  See application file for complete search history.

(56) References Cited

U.S. PATENT DOCUMENTS

| | | | |
|---|---|---|---|
| 8,737,122 B2 | 5/2014 | Saida et al. | |
| 8,817,529 B2 | 8/2014 | Aoki | |
| 8,829,580 B2 | 9/2014 | Sugiura et al. | |
| 8,896,041 B2 | 11/2014 | De Brosse et al. | |
| 8,897,061 B2 | 11/2014 | Ezaki | |
| 9,064,564 B2* | 6/2015 | Park | G11C 11/1657 |
| 9,076,537 B2 | 7/2015 | Khvalkovskiy et al. | |
| 2004/0257865 A1 | 12/2004 | Honjo et al. | |
| 2005/0152180 A1* | 7/2005 | Katti | H01L 27/222 365/158 |
| 2013/0201755 A1 | 8/2013 | Ezaki | |
| 2013/0223124 A1* | 8/2013 | Park | H01L 27/2436 365/96 |
| 2014/0169088 A1 | 6/2014 | Buhrman et al. | |
| 2015/0041934 A1 | 2/2015 | Khvalkovskiy et al. | |
| 2016/0276006 A1 | 9/2016 | Ralph | |

FOREIGN PATENT DOCUMENTS

| | | |
|---|---|---|
| JP | 2005-19457 A | 1/2005 |
| JP | 2005-19547 | 1/2005 |
| JP | 2010-245415 | 10/2010 |
| JP | 2011-40580 | 2/2011 |
| JP | 2012-39124 | 2/2012 |
| JP | 2013-69821 | 4/2013 |
| JP | 2013-125565 A | 6/2013 |
| JP | 2013-243336 A | 12/2013 |
| JP | 2014-45196 | 3/2014 |
| WO | WO 2009/110530 | 9/2009 |
| WO | WO 2009/110537 | 9/2009 |

* cited by examiner

MAGNETIC MEMORY BASED ON SPIN HALL EFFECT

CROSS REFERENCE TO RELATED APPLICATIONS

This application is a continuation application of U.S. application Ser. No. 15/262,139, filed Sep. 12, 2016, which is based upon and claims the benefit of priority from the prior Japanese Patent Application No. 2015-181175, filed on Sep. 14, 2015, the entire contents of which are incorporated herein by reference.

FIELD

Embodiments described herein relate generally to magnetic memories.

BACKGROUND

There is great interest with respect to benefits such as fast reading speed, fast writing speed, superior durability, nonvolatility, and low power consumption of magnetic random access memories (MRAMs). The MRAM is a nonvolatile memory including a giant magnetoresistive (GMR) element or a tunnel magneto resistance (TMR) element as a memory element, which stores information in the memory element.

One example of a MRAM is a spin transfer torque magnetic random access memory (STT-MRAM) in which a magnetization of a magnetic material is switchable by causing a current to flow into the magnetic material. A magnetization in a nanoscale magnetic material is easy to be controlled in a local magnetic field when the spin transfer torque method is used. The current for switching the magnetization is also expected to be low as the magnetic material is scaled down. In STT-MRAMs, switching of the magnetization caused by a read current is controlled by using a large current for writing and a low current for reading, and by using the same terminals.

The thermal stability of a magnetic material is given by an index $\Delta$ ($=K_u V/k_B T$), where $K_u$ represents the magnetic anisotropy of the magnetic material, V represents the volume of the magnetic material, $k_B$ represents the Boltzmann constant, and T represents an absolute temperature. In order to maintain the index $\Delta$ while miniaturization of the magnetic material is pursued, it is necessary to increase the magnetic anisotropy $K_u$. An increase in the magnetic anisotropy $K_u$ requires a larger write current. Therefore, maintaining the magnetic anisotropy $K_u$ is a trade-off between the decreasing write current and miniaturization (high density). Furthermore, writing error rates of the magnetic material are increased by the magnetization switching of the magnetic material caused by the read current.

Consequently, a method for using the spin Hall effect or the spin orbit interaction, in which a write current terminal and a read current terminal are separated from each other to lower the writing error rates, is proposed. This method improves writing error rates. However, it is a known fact that a spin Hall angle $\Theta_{SH}$ varies with the film thickness of a layer having spin orbit interaction (also referred to as a SOL (Spin Orbit Layer) hereinafter). The spin Hall angle represents the ratio of spin transmission to electric conductivity. When the current density in the SOL is constant, the value of the current increases with the thickness of the SOL. Therefore, it is important to suppress the thickness of the SOL.

However, when the SOL is thin, damages occur during manufacturing of magnetoresistive elements, wires break due to excessive etching and electromigration is caused when applying current. When damages or excessive etching are suppressed, the etching of portions of the magnetoresistive element is insufficient and the side walls of the magnetoresistive element have a tapered shape. As a result, the elements increase in size or there is an increase in size variation. Thus, there is a trade-off between a low write current due to a thinner SOL and low characteristics of the SOL.

DETAILED DESCRIPTION

A magnetic memory according to an embodiment includes: a first to third terminals; a first magnetoresistive element including a first magnetic layer, a second magnetic layer electrically connected to the first terminal, and a first nonmagnetic layer between the first magnetic layer and the second magnetic layer; a second nonmagnetic layer including a first to third portions, the first portion being located between the second portion and the third portion, the second portion being electrically connected to the second terminal, the third portion being electrically connected to the third terminal, the first magnetic layer being disposed between the first portion and the first nonmagnetic layer, and the second nonmagnetic layer being conductive; and a third nonmagnetic layer including a fourth to sixth portions, the fourth portion being located between the fifth portion and the sixth portion, the fourth portion being located between the first portion and the first magnetic layer, the fifth portion including a first region that extends from the first magnetoresistive element to the second terminal, the sixth portion including a second region that extends from the first magnetoresistive element to the third terminal, and the third nonmagnetic layer having an electrical conductivity higher than that of the second nonmagnetic layer.

Embodiments will now be explained with reference to the accompanying drawings.

First Embodiment

Figure 1:
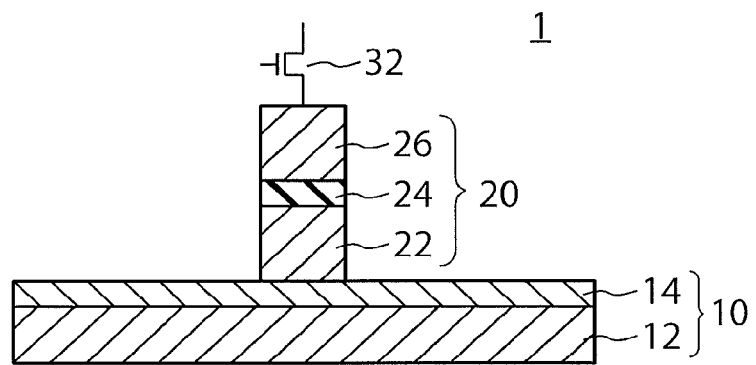
FIG. 1 is a cross-sectional view illustrating a memory element of a magnetic memory according to a first embodiment.

A magnetic memory according to a first embodiment will be explained with reference to FIG. 1. The magnetic memory includes at least one memory element, a cross-sectional view of which is illustrated in FIG. 1. The memory element 1 is a memory element using a spin orbit coupling (herein after also referred to as SO). The memory element 1 according to the first embodiment includes a nonmagnetic layer 10 and a magnetoresistive element 20 disposed on a part of regions of the nonmagnetic layer 10. The nonmagnetic layer 10 includes a first nonmagnetic layer 12 and a second nonmagnetic layer 14 disposed on the first nonmagnetic layer 12. In other words, the nonmagnetic layer 10 includes a nonmagnetic stacked structure of nonmagnetic materials.

The magnetoresistive element 20 includes a first magnetic layer 22 disposed on a part of regions of the second nonmagnetic layer 14, a nonmagnetic spacer layer 24 disposed on the first magnetic layer 22, and a second magnetic layer 26 disposed on the spacer layer 24. The first magnetic layer 22 has a changeable magnetization direction and the second magnetic layer 26 has a fixed magnetization direction. A "changeable magnetization direction" means that a magnetization direction of the first magnetic layer 22 is changeable before and after conducting a write operation to the magnetoresistive element 20. A "fixed magnetization direction" means that a magnetization direction of the second magnetic layer 26 is fixed or unchanged before and after conducting a write operation to the magnetoresistive element 20. When magnetization directions of the first magnetic layer 22 and the second magnetic layer 26 are parallel (same direction) in the magnetoresistive element 20, the resistance $R_P$ between the first magnetic layer 22 and the second magnetic layer 26 is low. When the magnetization directions of the first magnetic layer 22 and the second magnetic layer 26 are antiparallel (opposite directions), the resistance $R_{AP}$ between the first magnetic layer 22 and the second magnetic layer 26 is high.

When the current is caused to flow into the nonmagnetic layer 10 from a left side of FIG. 1 to a right side of FIG. 1, electrons of one of the types of spin, for example up-spin electrons, flow on a top side of the nonmagnetic layer 10, and electrons of the other type of spin, i.e. down-spin electrons, flow on a bottom side as a result of the spin orbit coupling. In other words, electrons polarized to one of the up-spin and the down-spin may flow into the nonmagnetic layer 10 on the top side and electrons polarized to the other of the up-spin and the down-spin may flow into the nonmagnetic layer 10 on the bottom side from the left side to the right side of FIG. 1. Therefore, the spin torque from the electrons polarized to one of the spins that flow on the top side impacts the magnetization of the first magnetic layer 22, the magnetization of the first magnetic layer 22 becoming switchable. The nonmagnetic layer 10 is a layer which exhibits spin orbit interaction.

Inversely to the above, when current is caused to flow into the nonmagnetic layer 10 from the right side of FIG. 1 to the left side of FIG. 1, down-spin electrons flow on the top side of the nonmagnetic layer 10 and up-spin electrons flow on the bottom side of the nonmagnetic layer 10, for example. Therefore, the magnetization direction of the first magnetic layer 22 can be switchable depending on direction of the current flowing into the nonmagnetic layer 10. Two terminals to cause the current to flow into the nonmagnetic layer 10 are disposed in two regions with the magnetoresistive element 20 therebetween. The write operation described above can be performed by causing the current to flow between the two terminals. When the magnetic memory includes a plurality of memory elements arrayed in matrix form, it is preferable to provide a selection transistor at one of the two terminals as shown in the ninth embodiment described later.

In the first embodiment, the nonmagnetic layer 10 is a stacked structure including the first nonmagnetic layer 12 and a second nonmagnetic layer 14, the electrical conductivity of the second nonmagnetic layer 14 being higher than that of the first nonmagnetic layer 12. In other words, assuming that $\sigma_1$ represents the electrical conductivity of the first nonmagnetic layer 12 and $\sigma_2$ represents the electrical conductivity of the second nonmagnetic layer 14, the following relationship is satisfied:

$\sigma_1 < \sigma_2$

The second nonmagnetic layer 14 has a high spin Hall angle to efficiently apply spin torque to the first magnetic layer 22 of the magnetoresistive element 20. The first nonmagnetic layer 12 serves to prevent breaking of and to suppress electromigration in the second nonmagnetic layer 14. By ensuring that $\sigma_1 < \sigma_2$, the current predominantly flows into the second nonmagnetic layer 14 at the expense of the first nonmagnetic layer 12, therefore it is possible to efficiently apply spin torque to the first magnetic layer 22 of the magnetoresistive element 20 using low current.

When the second nonmagnetic layer 14 is thinner than the spin diffusion length, the spin torque acting on the first magnetic layer 22 decreases under the influence of an opposite torque occurring on an interface opposite relative to the interface between the second nonmagnetic layer 14 and the first magnetic layer 22. However, in the first embodiment, the first nonmagnetic layer 12 displays a spin sink (spin absorption) effect. Therefore, even if the thickness of the second nonmagnetic layer 14 is less than the spin diffusion length, spin torque can be applied to the first magnetic layer 22 of the magnetoresistive element without spin torque decreasing.

Figure 2:
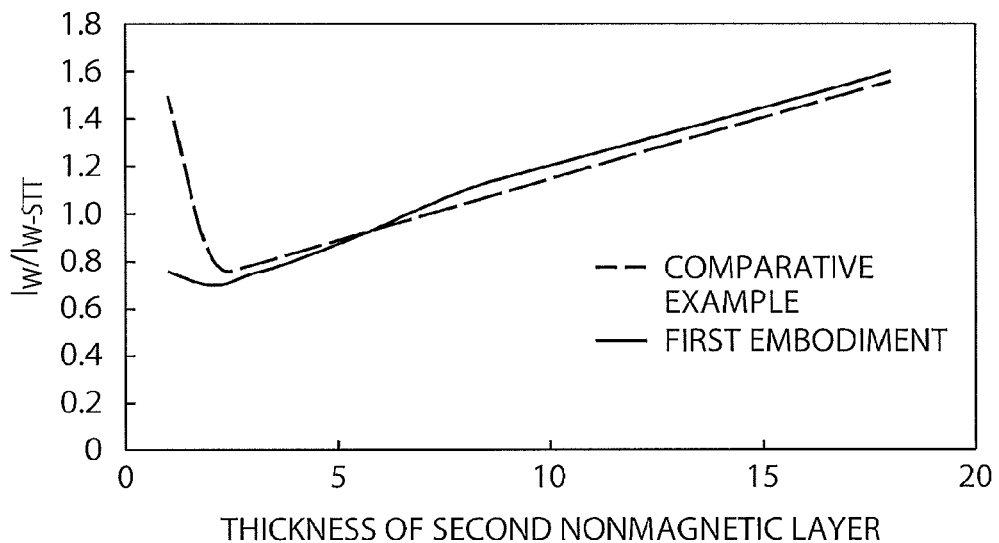
FIG. 2 is a diagram illustrating the effects of the first embodiment.

As a comparative example, a memory element having the same structure as that in the first embodiment, except that the nonmagnetic layer 10 has a single-layer structure, will be described below. In other words, in the comparative example, the nonmagnetic layer 10 consists of the second nonmagnetic layer 14. FIG. 2 shows simulation results representing the dependency of the thickness of the second nonmagnetic layer 14 on a value of the current that allows switching the magnetization of the first magnetic layer 22 in the memory elements according to the first embodiment and in the comparative example. In FIG. 2, the abscissa axis represents the thickness t (nm) of the second nonmagnetic layer 14 and the ordinate axis represents the value of the current capable of switching the magnetization of the first magnetic layer 22. In addition, in FIG. 2, the ordinate axis represents a value of the current $I_w$ capable to switch the magnetization of the first magnetic layer 22 and the value of the current $I_w$ is normalized with the current Iw-STT capable to switch the magnetization in the STT-MRAM. In the memory elements of the first embodiment and of the comparative example, in order to attribute an in-plane anisotropy to the magnetoresistive element 20, an aspect ratio, i.e. the ratio of length of the magnetoresistive element 20 in the lateral direction (the left to right horizontal direction in FIG. 1) to a length of the magnetization element 20 in the longitudinal direction (the front to back depth direction in FIG. 1), is equal to 2 and the length of the short side of the magnetoresistive element 20 is equal to 50 nm. The spin Hall angle is estimated at 0.15 and the spin diffusion length is estimated at 1 nm. Furthermore, in the memory elements of the first embodiment and in the comparative example, the current density necessary to write in the nonmagnetic layer 10 is constant.

When the thickness of the second nonmagnetic layer 14 is less than 7 nm in the first embodiment, the value of the current $I_w$ can be less than the value of the current $I_{w\text{-}STT}$ capable to switch the magnetization in the STT-MRAM in the first embodiment as shown in FIG. 2. Furthermore, when the thickness of the second nonmagnetic layer 14 is close to the spin diffusion length (1 nm), the memory element of the first embodiment can use a write current which is lower relative to the comparative example due to the spin sink effect.

In addition, when the thickness of the second nonmagnetic layer 14 is less than 10 nm, it was found that, in an outer region of the region where the magnetoresistive element 20 is located in the comparative example, disconnection and electromigration occur more often (not shown in FIG. 2). Therefore, it is preferable that the nonmagnetic layer 10 includes a stacked structure of two or more layers.

As described above, the writing of information (data) into the magnetoresistive element 20 can be conducted by providing one terminal each in two regions of the nonmagnetic layer 10 located on each side of the magnetoresistive element 20 (not shown in Figures) and by passing a current between the two terminals.

On the other hand, the reading of the data stored in the magnetoresistive element 20 can be conducted by passing a current between one of the abovementioned two terminals and a terminal connected to the second magnetic layer 26 of the magnetoresistive element 20 and by detecting a voltage between the one of the two terminals and the terminal connected to the second magnetic layer 26. In FIG. 1, the reading operation is conducted by using the selection transistor 32 connected to the second magnetic layer 26.

As described above, according to the first embodiment, it is possible to provide a magnetoresistive element capable of writing data using low current.

(Materials)

The materials constituting the memory element according to the first embodiment and the embodiments described later are explained below.

(Second Nonmagnetic Layer 14)

For the second nonmagnetic layer 14, it is preferable to use, without being limited to, materials having a high spin Hall effect, for example, materials having a large negative spin Hall angle such as β-Ta (tantalum) or β-W (tungsten), or materials having a large positive spin Hall angle such as Pt (platinum) or Au (gold).

(First Nonmagnetic Layer 12)

The first nonmagnetic layer 12 preferably contains at least one element selected from the group of Ru (ruthenium), Rh (rhodium), Ta (tantalum), W (tungsten), Cr (chromium), Ir (iridium), Mo (molybdenum), Re (rhenium), Nb (niobium), Pt (platinum), Pd (palladium), Hf (hafnium), Al (aluminum), or Mg (magnesium) as spin sink layer. As used herein, a phrase referring to "at least one of" a list of items refers to any combination of those items, including a single member. As an example, "at least one of: a, b, or c" is intended to cover a, b, c, a-b, a-c, b-c, and a-b-c."

Furthermore, the first nonmagnetic layer 12 may be a chemical compound, such as boride consisting of B (boron) and elements of the above group of elements. The boride, such as HfB, AlB, MgB, TiB, HfAlB, or HfAlB has not only spin sink effect, but may also compensate for the boron diffused from the first magnetic layer 22 when CoFeB is used as the first magnetic layer 22.

Furthermore, the first nonmagnetic layer 12 may be a material containing Hf. In this case, when there are deposits on the side of the spacer layer (made of MgO, etc.), the magnetoresistive element 20 will have high MR ratio or TMR ratio due to the superior insulating characteristics of the Hf-based first nonmagnetic layer 12.

In addition, it is necessary that the electrical conductivity of the first nonmagnetic layer 12 is lower than that of the second nonmagnetic layer 14 in order to satisfy the relational expression of $\sigma_1 < \sigma_2$. However, when the second nonmagnetic layer 14 is made of β-Ta or β-W, the resistivity (inverse value of the electrical conductivity) is high, several hundred μΩcm to 1000 μΩcm, meaning that the electrical conductivity is low. Therefore, oxides or nitrides of the above described material may be used to further decrease the electrical conductivity. An amount of oxidation or nitridation may be controlled by plasma processing, and the electrical conductivity may be decreased by oxidation or nitridation while ensuring that the first nonmagnetic layer 12 does not become an insulator.

When the second nonmagnetic layer 14 contains Ta or W, the first nonmagnetic layer 12 may contain the same elements as the second nonmagnetic layer 14 but differ from the second nonmagnetic layer 14 in crystallinity. As described above, the resistivity of β-Ta or β-W is high, several hundred μΩcm to 1000 μΩcm, but the resistivity may be further raised when the first nonmagnetic layer 12 has an amorphous structure.

In addition, when the second nonmagnetic layer 14 contains Ta or W, the resistivity may be decreased by using α-Ta or α-W for the first nonmagnetic layer 12. The resistivity (or conductivity) may be controlled by making the first nonmagnetic layer 12 have a different crystallinity. Therefore, a structure where the first nonmagnetic layer 12 and the second nonmagnetic layer 14 contain the same elements but of different crystallinity is also possible.

(First Magnetic Layer 22)

The first magnetic layer 22 may contain a ferromagnetic material, soft magnetic material, artificial superlattice, or ferrimagnetic material or the like. As ferromagnetic material, magnetic material having a $L1_0$ structure or a $L1_1$ structure may be used. As more specific examples, FePd (iron-palladium), FePt (iron-platinum), CoPd (cobalt-palladium), or CoPt (cobalt-platinum) may be used. CoFeB (cobalt-iron-boron) or the like is used as soft magnetic material. As artificial superlattice a stacked structure including magnetic materials such as NiFe (nickel-iron), Fe (iron), or Co (cobalt), and nonmagnetic materials such as Cu (copper), Pd (palladium), or Pt (platinum).

For the first magnetic layer 22, magnetic materials having in-plane magnetic anisotropy or perpendicular magnetic anisotropy may be used. It is preferable to use a magnetic material having in-plane magnetic anisotropy in order to decrease current inversion.

(Spacer Layer 24)

The spacer layer 24 may include MgO (magnesium oxide). When the spacer layer 24 is made of insulation material such as MgO, it is also called a tunnel barrier layer. As an example, the thickness of the MgO layer 24 is 10 Å (1 nm). The spacer layer 24 may also include CaO (calcium oxide), SrO (strontium oxide), TiO (titan oxide), VO (vanadium oxide), NbO (niobium oxide), or AlO (aluminum oxide).

The spacer layer 24 may include nitride of Mg or Al. Without being limited to being a single layer of such oxide or nitride, the spacer layer 24 may have a stacked structure including such insulators. The MgO has a crystalline structure of a NaCl (sodium chloride) structure. As a material having a crystalline orientation similar to that of the MgO, a spinel type material such as $MgAl_2O_3$ may be used. The spacer layer 24 may also include nonmagnetic material such as Cu.

(Second Magnetic Layer 26)

Generally, for thermal stability purposes, the thickness of the second magnetic layer 26 exceeds that of the first magnetic layer 22. Therefore, since a magnetic field distribution generated from the second magnetic layer 26 is larger, the leakage field generated from the second magnetic layer 26 is non-uniformly applied to the first magnetic layer 22. The leakage field generated from the second magnetic layer 26 acts on the first magnetic layer 22 to change the magnetization direction of the first magnetic layer 22 to be parallel to the magnetization direction of the second magnetic layer 26. The leakage field that is applied to the first magnetic layer 22 changes the magnetic field of magnetization switching, and deteriorates the thermal stability of the first magnetic layer 22. The coercive force $H_c$ of the first magnetic layer 22 is shifted in consequence of the leakage field generated from the second magnetic layer 26, and the thermal stability of magnetization orientation state of the first and second magnetic layers 22 and 26 may change depending on whether the magnetization directions of the first and second magnetic layers are parallel or antiparallel. In this way, since the behavior of the magnetoresistive element may become unstable due to the leakage field of the second magnetic layer 26, it is preferable that the saturated magnetization $M_s$ of the second magnetic layer 26 is low.

The second magnetic layer 26 may include materials such as Co (cobalt), or CoFeB (cobalt-iron-boron). The magnetization direction of the second magnetic layer 26 may be pinned by an antiferromagnetic material such as IrMn (iridium manganese) in order to provide in-plane magnetic anisotropy. In this case, the layer including the antiferromagnetic material is disposed in the vicinity of the second magnetic layer 26.

In the case of perpendicularly magnetizing the magnetic material, a magnetic layer including rare-earth metals and transition metals, of low saturated magnetization Ms and large magnetization anisotropy is used. The above described magnetic layer is referred to as a rare-earth metal-transition metal magnetic layer. This magnetic layer may consist of, for example, TbCoFe (terbium-cobalt-iron), an artificial superlattice stacking Co and Pt, or a crystalline layer of Fe and Pt which are regularized to $L1_0$ structure.

Figure 3:
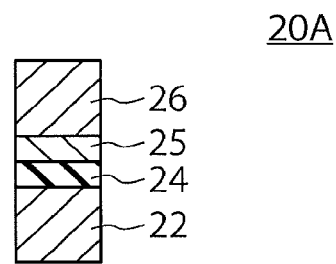
FIG. 3 is a cross-sectional view illustrating a magnetoresistive element in a memory element of a magnetic memory according to a modification of the first embodiment.

As a modification of the first embodiment, a magnetoresistive element 20A shown in FIG. 3 may be used instead of the magnetoresistive element 20. The magnetoresistive element 20A according to the modification of the first embodiment includes a magnetic layer (interfacial magnetic layer) 25 being sandwiched between the second magnetic layer 26 and the spacer layer 24 of the magnetoresistive element 20 shown in FIG. 1 of the first embodiment. The above described structure makes it possible to increase a spin polarizability of the second magnetic layer 26 and thereby to obtain a magnetoresistive element of a high MR (magnetoresistance) ratio.

Second Embodiment

Figure 4:
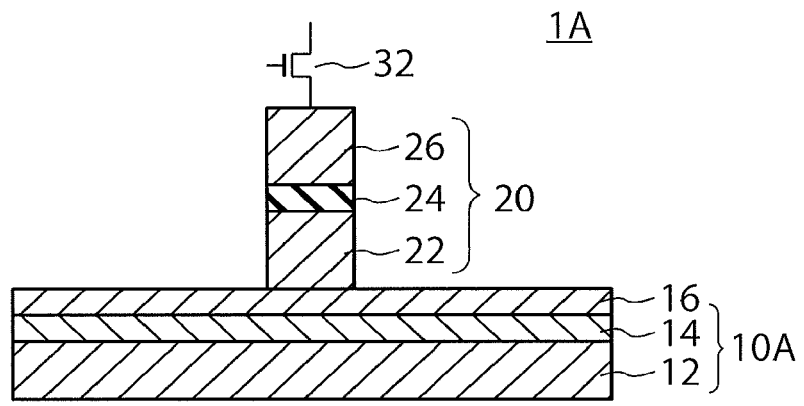
FIG. 4 is a cross-sectional view illustrating a memory element of a magnetic memory according to a second embodiment.

A magnetic memory according to a second embodiment will be described with reference to FIG. 4. The magnetic memory according to the second embodiment includes at least one memory element, a cross-sectional view of which is shown in FIG. 4. The memory element 1A of the second embodiment is obtained by replacing the nonmagnetic layer 10 in the memory element of the first embodiment, with a nonmagnetic layer 10A. The nonmagnetic layer 10A is obtained by disposing a third nonmagnetic layer 16 on the second nonmagnetic layer 14 of the nonmagnetic layer 10 shown in FIG. 1, the third nonmagnetic layer having an electric conductivity lower than that of the second nonmagnetic layer 14.

The above described structure makes it possible to more effectively pass current in the second nonmagnetic layer 14. Rephrasing, it is possible to suppress current from leaking toward the magnetoresistive element 20 during the write operation. Furthermore, since a role of the third nonmagnetic layer 16 is to protect the second nonmagnetic layer 14 when the magnetoresistive element 20 is etched, it is possible to prevent the deterioration of spin Hall angle cause by damages to the second nonmagnetic layer 14. It is also possible to suppress the occurrence of electromigration.

In the second embodiment, the third nonmagnetic layer 16 may consist of the same material as the first nonmagnetic layer 12. The third nonmagnetic layer 16 may also consist of a material different from that of the first nonmagnetic layer 12.

In the second embodiment, the magnetoresistive element 20 may be replaced by the magnetoresistive element 20A shown in FIG. 3.

As described above, similarly to the first embodiment, the second embodiment can provide a magnetic memory capable of performing the write operation with low current.

Third Embodiment

Figure 5:
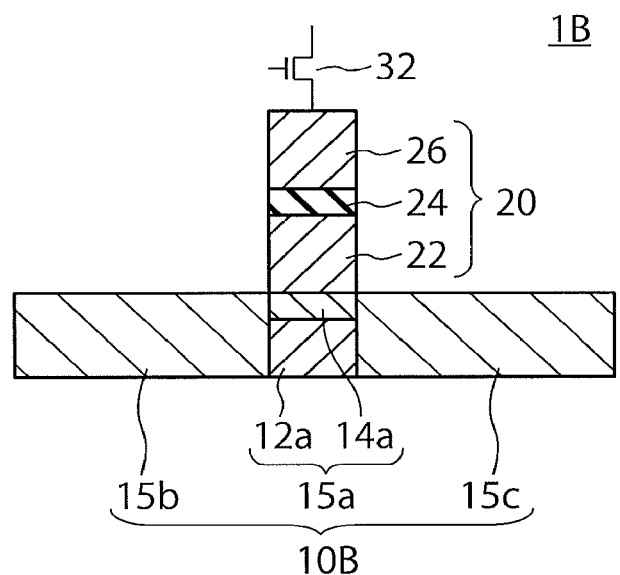
FIG. 5 is a cross-sectional view illustrating a memory element of a magnetic memory according to a third embodiment.

A magnetic memory according to a third embodiment will be described with reference to FIG. 5. The magnetic memory according to the third embodiment includes at least one memory element, a cross-sectional view of which is shown in FIG. 5. The memory element 1B of the third embodiment is obtained by replacing the nonmagnetic layer 10 in the memory element 1 of the first embodiment shown in FIG. 1, with a nonmagnetic layer 10B.

The nonmagnetic layer 10B includes a first portion 15a located beneath the magnetoresistive element 20, and a second portion 15b and a third portion 15c which are located on both sides of the first portion 15a and in contact with the first portion 15a. The first portion 15a includes a first layer 12a that is formed of the same material as the first nonmagnetic layer 12 described in the first embodiment, and a second layer 14a located on the first layer 12a, the second layer 14a being formed of the same material as the second nonmagnetic layer 14. Consequently, the first layer 12a has the same electrical conductivity $\sigma_1$ as the first nonmagnetic layer 12, and the second layer 14a has the same electrical conductivity $\sigma_2$ as the second nonmagnetic layer 14. The first portion 15a has substantially the same width (a length in a horizontal direction) as the first magnetic layer 22. In other words, the first layer 12a and the second layer 14a have substantially the same width as the first magnetic layer 22.

The second and third portions 15b, 15c are formed of a nonmagnetic material having higher electrical conductivity than those of the first layer 12a and the second layer 14a. Assuming that $\sigma_3$ denotes the electrical conductivity of the second and third portions 15b, 15c, the following relationship is satisfied:

$$\sigma_1 < \sigma_2 < \sigma_3$$

The second portion 15b and the third portion 15c may be formed of the same material, or of different materials. Even when the second portion 15b and the third portion 15c are formed of different materials, the above described relationship is satisfied.

In the magnetic memory of the third embodiment which has the above structure, although the manufacturing of the memory element is complicated, the second portion 15b and the third portion 15c are formed of material having high electrical conductivity. Therefore, it is possible to increase an overall electrical conductivity of the nonmagnetic layer 10B without changing an amount of the spin torque acting on the first magnetic layer 22 of the magnetoresistive element 20, thereby improving the resistance to electromigration.

The second portion 15b and the third portion 15c may be formed of a nonmagnetic material having an electrical conductivity which is in a range defined by the electrical conductivity of the first layer 12a and the second layer 14a.

In the third embodiment, the magnetoresistive element 20 may be replaced with the magnetoresistive element 20A shown in FIG. 3.

In the third embodiment, similarly to the second embodiment shown in FIG. 4, a nonmagnetic layer having an electrical conductivity lower than that of the first layer 12a may be disposed between the first magnetic layer 22 and the second layer 14a.

Similarly to the first embodiment, the third embodiment can provide a magnetic memory capable performing the write operation with low current.

Fourth Embodiment

Figure 6:
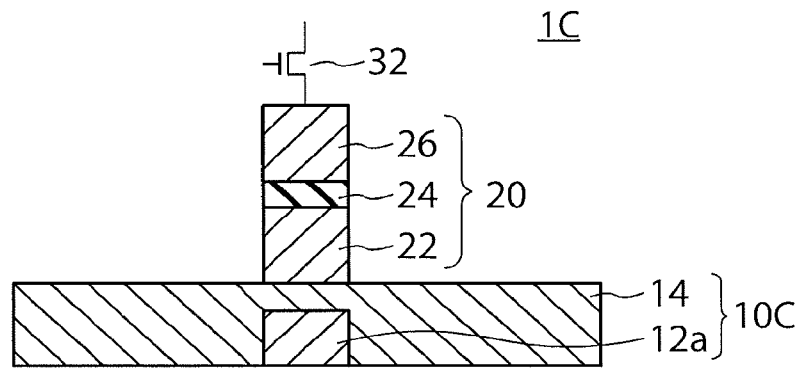
FIG. 6 is a cross-sectional view illustrating a memory element of a magnetic memory according to a fourth embodiment.

A magnetic memory according to a fourth embodiment will be described with reference to FIG. 6. The magnetic memory according to the fourth embodiment includes at least one memory element, a cross-sectional view of which is shown in FIG. 6. The memory element IC of the fourth embodiment is obtained by replacing the nonmagnetic layer 10B in the memory element 1B of the third embodiment shown in FIG. 5, with a nonmagnetic layer 10C.

The nonmagnetic layer 10C has the structure of the nonmagnetic layer 10B where the second portion 15b and the third portion 15c of the nonmagnetic layer 10B are formed of the same material as the second nonmagnetic layer 14. In other words, the second nonmagnetic layer 14 is disposed to cover a top and side faces of the first layer 12a which is beneath the magnetoresistive element 20.

Therefore, in the fourth embodiment, since compared to the first embodiment a volume of the second nonmagnetic layer 14 in the nonmagnetic layer 10C is large, it is possible to increase the overall electrical conductivity of the nonmagnetic layer 10B relative to that of the nonmagnetic layer 10 in the first embodiment.

In any one of the third and fourth embodiment, the first layer 12a has the capacity to absorb or sink an opposite spin. Although a thickness of the second nonmagnetic layer 14 is made smaller than the spin diffusion length, it is possible to prevent the spin torque acting on the first magnetic layer 22 of the magnetoresistive element from decreasing compared with the case that the nonmagnetic layer 10B is constituted solely of the second nonmagnetic layer 14 without the first layer 12a.

In the fourth embodiment, the magnetoresistive element 20 may be replaced with the magnetoresistive element 20A shown in FIG. 3.

Similarly to the third embodiment, the fourth embodiment can provide a magnetic memory capable of performing the write operation with low current.

Fifth Embodiment

Figure 7:
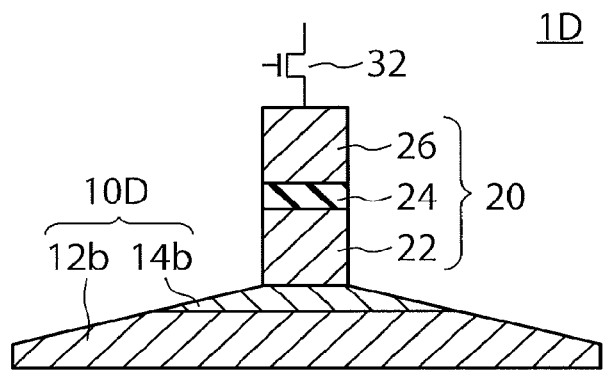
FIG. 7 is a cross-sectional view illustrating a memory element of a magnetic memory according to a fifth embodiment.

A magnetic memory according to a fifth embodiment will be described with reference to FIG. 7. The magnetic memory according to the fifth embodiment includes at least one memory element, a cross-sectional view of which is shown in FIG. 7. The memory element 1D of the fifth embodiment is obtained by replacing the nonmagnetic layer 10 in the memory element 1 of the first embodiment shown in FIG. 1, with a nonmagnetic layer 10D.

The nonmagnetic layer 10D has a structure that the distance between a top face and a bottom face of the nonmagnetic layer 10D decreases with the increase of a distance from each of the side faces of the magnetoresistive element 20 toward the edges of the nonmagnetic layer 10D. In other words, the top face of the nonmagnetic layer 10D slopes downward except in a region where the magnetoresistive element 20 is disposed.

The abovementioned structure is formed due to excessive etching during the etching process to define a shape of the magnetoresistive element 20 as part of the later described manufacturing method. The nonmagnetic layer 10D of the fifth embodiment includes a first nonmagnetic layer 12b formed of the same material as the first nonmagnetic layer 12, and a second nonmagnetic layer 14b disposed on the first nonmagnetic layer 12b and formed of the same material as the second nonmagnetic layer 14. The second nonmagnetic layer 14b includes a first portion on which the magnetoresistive element 20 is disposed, and a second portion. The first portion has a constant thickness and the second portion has a structure where the thickness of the second portion decreases with the increase of a distance from the side faces of the magnetoresistive element 20.

The first nonmagnetic layer 12b includes a first portion of constant thickness on which the second nonmagnetic layer 14b is disposed, and a second portion of thickness decreasing with the increase of a distance from the edges of the second nonmagnetic layer 14b.

In the memory element including the nonmagnetic layer 10D having the above described structure, since the first magnetic layer 22 of the magnetoresistive element 20 is adjacent to the second nonmagnetic layer 14b, similarly to the first embodiment, it is possible to impact the spin torque of the first magnetic layer 22 thus becoming possible to effectively apply spin torque to the first magnetic layer 22 using low current.

In addition, the thickness of the second nonmagnetic layer 14b linearly decreases with the increase of a distance from the side faces of the magnetoresistive element 20, and the thickness of the first nonmagnetic layer 12b linearly decreases in an outward direction away from the edges of the second nonmagnetic layer 14b. Therefore, it is possible to suppress disconnection or electromigration due to local current concentration.

Since the thickness of the nonmagnetic layer 10D gradually decreases with the increase of a distance from the side faces of the magnetoresistive element 20, the nonmagnetic layer 10D has no particular areas where strain-stress concentrates. It is also possible to suppress characteristic variation due to the magnetic strain of the magnetoresistive element 20, and spin torque variation due to crystalline variation of the nonmagnetic layer 10D. Since the width of the second nonmagnetic layer 14b in a horizontal direction in FIG. 7 is larger than that of the first magnetic layer 22, it is possible to apply spin torque from the edges of the first magnetic layer 22. Therefore, magnetization switching can be effectively conducted, in other words, using low current compared to a magnetic memory in which the thickness of the first and second nonmagnetic layers is abruptly decreases.

In the fifth embodiment, the magnetoresistive element 20 may be replaced with the magnetoresistive element 20A shown in FIG. 3.

Similarly to the first embodiment, the fifth embodiment can provide a magnetic memory capable of performing the write operation with low current.

Sixth Embodiment

Figure 8:
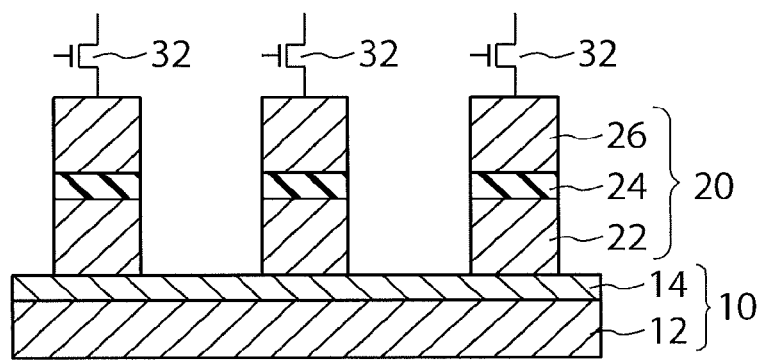
FIG. 8 is a cross-sectional view illustrating a magnetic memory according to a sixth embodiment.

FIG. 8 shows a magnetic memory according to a sixth embodiment. The magnetic memory of the sixth embodiment includes a nonmagnetic layer 10 including a first nonmagnetic layer 12 and a second magnetic layer 14 disposed on the first nonmagnetic layer 12, and on top of the nonmagnetic layer 10, a plurality of magnetoresistive elements 20 as described in the first embodiment.

When a plurality of magnetoresistive elements is disposed in an array and one magnetoresistive element 20 is disposed to each of the nonmagnetic layers 10, at least one selection transistor is required for every nonmagnetic layer 10.

However, when the plurality of magnetoresistive elements 20 is disposed on the nonmagnetic layer 10 like in the sixth embodiment, it is possible to decrease the number of selection transistors compared to a magnetic memory in which one magnetoresistive element 20 is disposed to every nonmagnetic layer 10.

Meanwhile, when recording (performing the write operation), all of the magnetoresistive elements 20 are applied spin torque. Therefore, the current $I_W$ applied to the nonmagnetic layer 10 is adjusted so that switching is not caused by spin torque. Due to voltage being selectively applied to the magnetoresistive element 20 which actually performs the write switching, the coercive force of the first magnetic layer 22 of the magnetoresistive element 20 is reduced and the adjusted current $I_W$ can make the switch. Similarly, the spin transfer torque is applied to the magnetoresistive element 20 which performs the write switching by passing current through the magnetoresistive element 20, thereby the adjusted current $I_W$ can switch magnetization of only the magnetoresistive element 20 to perform the write switching.

In the sixth embodiment, the magnetoresistive element 20 may be replaced with the magnetoresistive element 20A shown in FIG. 3.

Similarly to the first embodiment, the sixth embodiment can provide a magnetic memory capable of performing the write operation with low current.

Seventh Embodiment

Figure 9:
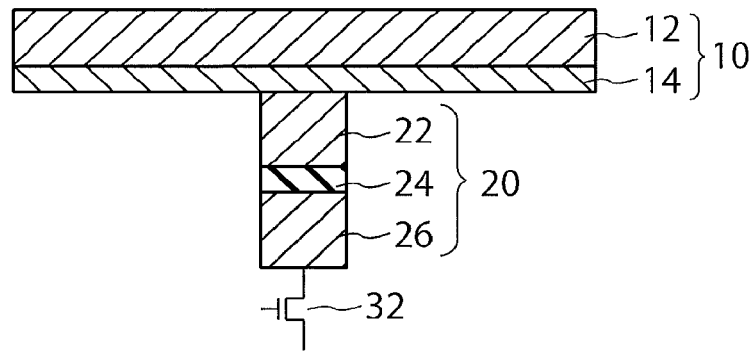
FIG. 9 is a cross-sectional view illustrating a memory element of a magnetic memory according to a seventh embodiment.

A magnetic memory according to a seventh embodiment will be described with reference to FIG. 9. The magnetic memory according to the seventh embodiment includes at least one memory element, a cross-sectional view of which is shown in FIG. 9. The memory element 1E of the seventh embodiment is obtained by reversing the stacking order of the memory element 1 of the first embodiment shown in FIG. 1. The memory element 1E includes a structure in which the spacer layer 24 is disposed on the second magnetic layer 26, the first magnetic layer 22 is disposed on the spacer layer 24, the second nonmagnetic layer 14 is disposed on the first magnetic layer 22, and the first nonmagnetic layer 12 is disposed on the second nonmagnetic layer 14.

When the nonmagnetic layer 10 is formed after forming the magnetoresistive element 20, the insulator material is embedded after etching the magnetoresistive element 20 to define its outline, and a surface of the insulator material is flattened to expose a surface of the first magnetic layer 22 of the magnetoresistive element 20. After that, the nonmagnetic layer 10 is formed. Thus, since the degree of flatness of the nonmagnetic layer 10 is not high when the nonmagnetic layer 10 is formed, disconnection and electromigration frequently occur if a nonmagnetic layer having a thickness of several nm is formed as a single layer.

However, similarly to the seventh embodiment, when the nonmagnetic layer has a two-layer structure consisting of the first nonmagnetic layer 12 and the second nonmagnetic layer 14, it is possible to considerably decrease failures due to disconnection and electromigration.

When the second nonmagnetic layer 14 has a thickness of 5 nm or less, the first nonmagnetic layer 12 has also the capacity to sink spin. Therefore, the memory element 1E of the seventh embodiment can reduce the necessary write current compared to a magnetic memory in which the nonmagnetic layer 10 has the second nonmagnetic layer 14 but not the first nonmagnetic layer 12.

In the seventh embodiment, the magnetoresistive element 20 may be replaced with the magnetoresistive element 20A shown in FIG. 3.

Similarly to the first embodiment, the seventh embodiment can provide a magnetic memory capable of performing the write operation with low current.

First Modification

Figure 10:
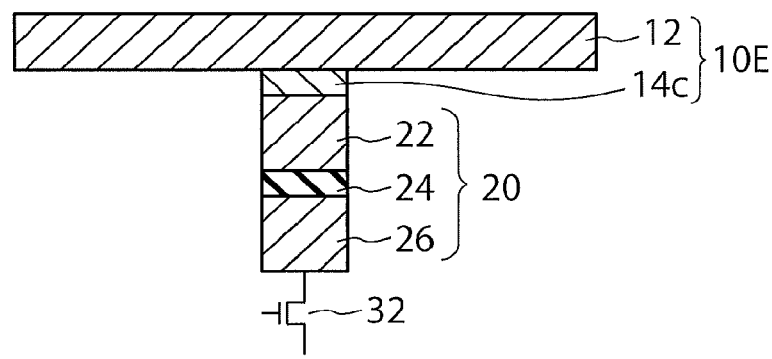
FIG. 10 is a cross-sectional view illustrating a memory element of a magnetic memory according to a first modification of the seventh embodiment.

A magnetic memory according to a first modification of the seventh embodiment will be described with reference to FIG. 10. The magnetic memory of the first modification includes at least one memory element, a cross-sectional view of which is shown in FIG. 10.

The memory element 1F is obtained by replacing the nonmagnetic layer 10 of the memory element 1E of the seventh embodiment with a nonmagnetic layer 10E. The nonmagnetic layer 10E includes a second nonmagnetic layer 14c which is disposed on the first magnetic layer 22 and has the same planar shape as the first magnetic layer 22, and the first nonmagnetic layer 12 disposed on the second nonmagnetic layer 14c. In other words, the nonmagnetic layer 14c is etched at the same time that the magnetoresistive element 20 is etched to define a shape of the magnetoresistive element 20. Subsequently, an insulator film is embedded, and a surface of the insulator film is flattened to expose a surface of the second nonmagnetic layer 14c. After that, the first nonmagnetic layer 12 is formed.

In the memory element 1F having such a structure, the second nonmagnetic layer 14c is a capping layer of the magnetoresistive element 20.

Similarly to the seventh embodiment, the first modification can provide a magnetic memory capable of performing the write operation with low current.

In the first modification, the magnetoresistive element 20 may be replaced with the magnetoresistive element 20A shown in FIG. 3.

Second Modification

Figure 11:
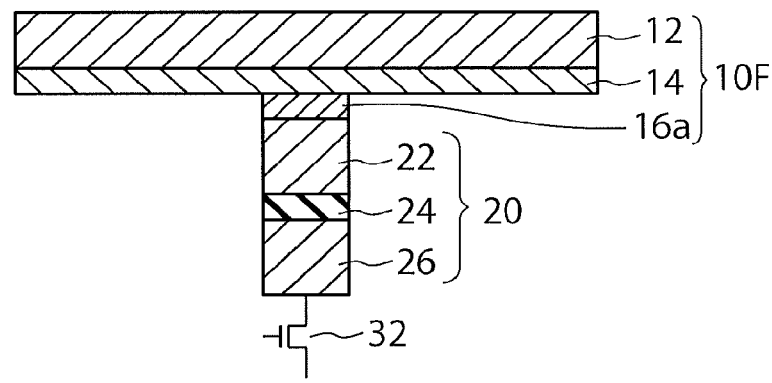
FIG. 11 is a cross-sectional view illustrating a memory element of a magnetic memory according to a second modification of the seventh embodiment.

A magnetic memory according to a second modification of the seventh embodiment will be described with reference to FIG. 11. The magnetic memory according to the second modification includes at least one memory element 1G a cross-sectional view of which is shown in FIG. 11.

The memory element 1G is obtained by disposing a third nonmagnetic layer 16a between the first magnetic layer 22 and the second nonmagnetic layer 14 of the memory element 1E of the seventh embodiment shown in FIG. 9. The third nonmagnetic layer 16a includes a material having a lower electrical conductivity than that of the second nonmagnetic layer 14. The third nonmagnetic layer 16a may be formed of the same material as the first nonmagnetic layer 12 or from a material different from the second nonmagnetic layer 12.

Similarly to the seventh embodiment, the second modification can provide a magnetic memory capable of performing the write operation with low current.

In the second modification, the magnetoresistive element 20 may be replaced with the magnetoresistive element 20A shown in FIG. 3.

Eighth Embodiment

Figure 12:
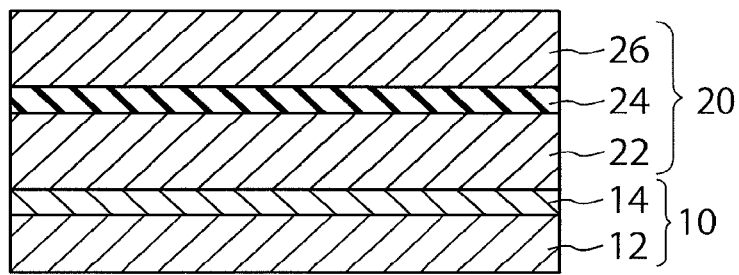
FIGS. 12 to 14 are cross-sectional views illustrating a method of manufacturing a magnetic memory according to an eighth embodiment.

A method of manufacturing a magnetic memory according to an eighth embodiment will be described with reference to FIGS. 12 and 13. The manufacturing method according to the eighth embodiment is a method for manufacturing the magnetic memory of the fifth embodiment shown in FIG. 7.

First, the first nonmagnetic layer 12, the second nonmagnetic layer 14, the first magnetic layer 22, the spacer layer 24, and the second magnetic layer 26 are stacked on a substrate (not shown) in this order.

Figure 13:
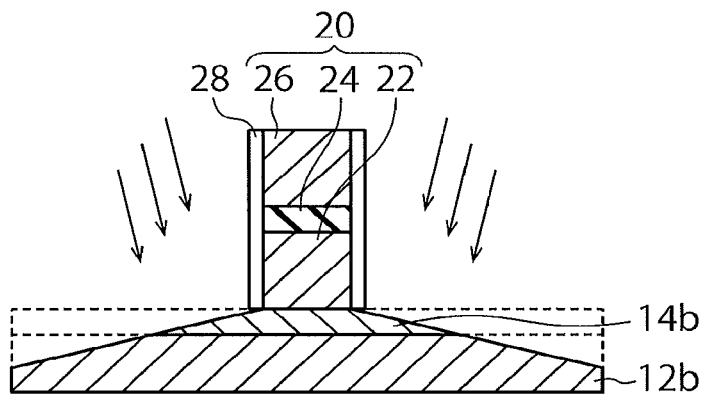

Next, a stacked film including the second magnetic layer 26, the spacer layer 24, and the first magnetic layer 22 is processed by means of ion beam etching (hereinafter also referred to as IBE) to define the outline of the magnetoresistive element 20 as shown in FIG. 13. IBE processing is conducted by ion milling with an inert gas such as Ar or the like. In IBE processing, by having an incident ion enter the stacked film at an angle of, for example, 50 degrees from a direction perpendicular to a film surface of the stacked film of the magnetoresistive element 20, an adhesion layer is not formed on side faces of the spacer layer 24. IBE processing is conducted, for example, until an upper portion of the second nonmagnetic layer 14 is processed. In this case, a portion of the first nonmagnetic layer 12 is subjected to milling. The milling defines the planar shape of the magnetoresistive element.

Subsequently, the IBE incidence angle is changed to be perpendicular to the surface of the stacked film, and the first nonmagnetic layer 12 is further processed by milling as a taper shape, which was created in a shade portion during IBE processing that the incident ion beam inclined, is removed. As a result, a portion of the first nonmagnetic layer 12, which is processed by milling with Ar ions, is deposited to form an adhesion layer 28 on the side portions of the layered film (FIG. 13). The nonmagnetic layer 10 becomes the nonmagnetic layer 10D as a result of the milling, and the memory element 1D of the fifth embodiment is formed.

Figure 14:
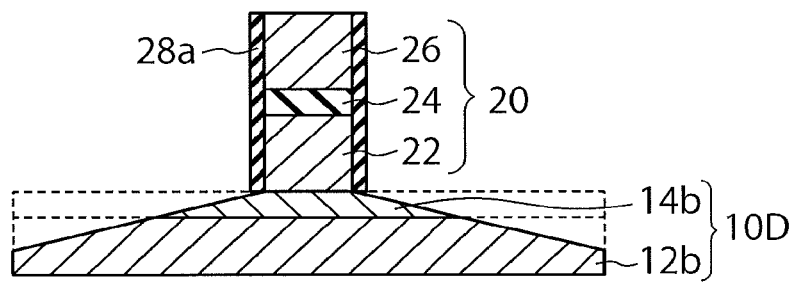

As shown in FIG. 14, the adhesion layer 28 which is deposited on the side portions of the stacked film is oxidized or nitrided to form an insulated adhesion layer 28a. In this case, the oxidization of the adhesion layer 28 is realized by, for example, exposure to the atmosphere. However, the oxidization of the adhesion layer 28 may be realized by methods other than exposure to the atmosphere, such as exposure to oxygen gas, radical oxygen, plasma oxygen, or cluster oxygen ions in the vacuum, thereby being able to sufficiently oxidize the adhesion layer 28. In addition, the nitridation of the adhesion layer 28 is conducted by using, for example, radical nitrogen, plasma nitrogen, or cluster nitrogen ions. It is preferable that the oxides or nitrides of the adhesion layer 28a insulating properties are ensured irrespective of their valences.

When the adhesion layer 28 deposited on the side portions of the spacer layer 24 is conductive, an electrical path is formed on the side portions of the spacer layer 24, and a short circuit occurs. It is preferable that the electrical resistivity of the adhesion layer 28a is 0.0005 $\Omega cm^2$ or more to avoid a short circuit. In addition, even if metal deposited on the side portions of the spacer layer 24 is insulated by oxidation or the like, if the breakdown voltage of the insulating layer is lower than that of the spacer layer 24, the breakdown voltage decreases and the insulating capacity is degraded by the repeated read and write operations to the magnetoresistive element 20. In other words, it is preferable that the adhesion layer 28 is formed of the same material as the spacer layer 24, or of material having a higher breakdown voltage at oxidation.

When MgO or MgO including B (boron) is used as the spacer layer 24, the breakdown voltage becomes approximately 5 MV/cm to 20 MV/cm. Therefore, it is preferable that MgO or MgBO which are oxidized, or material having a breakdown voltage of 5 MV/cm or more when oxidized is used as the adhesion layer 28. More specifically, it is preferable that the oxide, which is obtained by oxidizing material including B and at least one element selected from a group consisting of Hf, Al, Mg, or Ti, is used as the adhesion layer 28.

In addition, in the manufacturing step shown in FIG. 14, the oxidization to insulate the adhesion layer 28 is necessary to a step of exposing to oxygen gas, radical oxygen, or plasma oxygen. In the oxidizing process of the adhesion layer 28, if the oxygen concentration is too high, the first magnetic layer 22, the second magnetic layer 26, or the nonmagnetic layer 10 is oxidized, and the magnetic characteristics or the electrical conductivity depreciate. It is preferable that the process for oxidizing the adhesion layer 28 allows the full oxidation of the adhesion layer 28 while being weak so that it does not oxidize the magnetic body. In other words, it is preferable that the material of the adhesion layer 28 is easily oxidized compared to the first and second magnetic layers.

When the nitriding process is used for insulating the adhesion layer 28, BN, MgN, and AlN are insulating materials having high dielectric withstanding voltage. Therefore, it is possible to manufacture a magnetoresistive element 20 without insulation defects by using a material including Mg, Al, or B as the main constituent, by having the material including Mg, Al, or B deposit on the side portions of the spacer layer 24 as a result of IBE when defining the outline of the magnetoresistive element 20, and by nitriding the deposited material.

Fe or Co included in the first magnetic layer 22 has weak reactive property to nitrogen compared to oxygen. So if a material, which is easily nitrided and has favorable insulating characteristics and breakdown voltage after nitriding, is used as the adhesion layer 28, it is possible, by means of nitriding, to suppress the degradation of the magnetic characteristics of the first and second magnetic layers 22 and 26 and to insulate the adhesion layer 28.

As shown in FIGS. 13 and 14, even if, due to excessive milling, the second nonmagnetic layer 14 is nonexistent in regions other than that where the magnetoresistive element 20 is formed, current may pass through the lower part of the first nonmagnetic layer 12b without breaking in the layer.

Similarly to the fifth embodiment, the eighth embodiment can also provide a magnetic memory capable of performing the write operation with low current.

Ninth Embodiment

Figure 15:
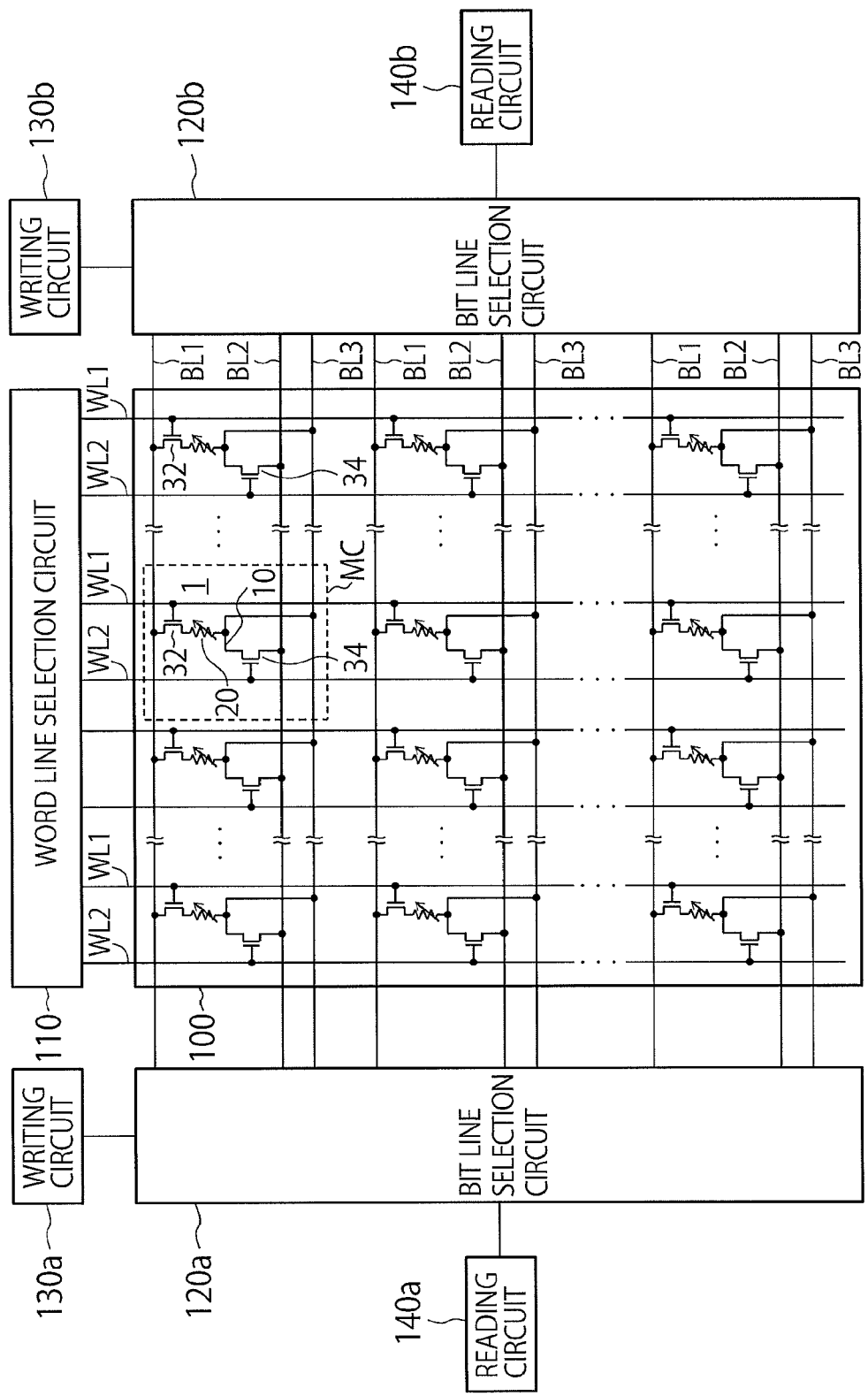
FIG. 15 is a circuit diagram illustrating a magnetic memory according to a ninth embodiment.

FIG. 15 shows a circuit of a magnetic memory according to a ninth embodiment. The magnetic memory of the ninth embodiment includes a memory cell array 100 in which memory cells MC are arranged in a array form having rows and columns, two word lines WL1, WL2 disposed corresponding to each of the columns, three bit lines BL1, BL2, and BL3 disposed corresponding to each of the rows, a word line selection circuit 110, bit line selection circuits 120a and 120b, writing circuits 130a and 130b, and reading circuits 140a and 140b.

Each of the memory cells MC includes a memory element according to any one of the first to seventh embodiments, and selection transistors 32 and 34. In the descriptions of the ninth embodiment, the memory element is the memory element 1 of the first embodiment shown in FIG. 1.

In the memory cell MC, as shown in FIG. 1, the memory element 1 includes a nonmagnetic layer (nonmagnetic stacked film) 10, and a magnetoresistive element 20. One terminal of the magnetoresistive element 20 is connected to the second nonmagnetic layer 14 (see FIG. 1) of the nonmagnetic layer 10, the other terminal of the magnetoresistive element 20 being connected to one of a source and a drain of the selection transistor 32. The other of the source and the drain of the selection transistor 32 is connected to the bit line BL1, and a gate of the selection transistor 32 is connected to the word line WL1. The nonmagnetic layer 10 has one terminal connected to one of the source and the drain of the selection transistor 34, and another terminal connected to the bit line BL3. The other of the source and the drain of the selection transistor 34 is connected to the bit line BL2 and a gate of the selection transistor 34 is connected to the word line WL2.

(Writing Operation)

The writing to the memory cell is described below. First, the word line selection circuit 110 applies a high level voltage to the word line WL2 to which the gate of the selection transistor 34 is connected, thereby turning on the selection transistor 34 of the memory cell MC which performs the write operation. At this time, the selection transistors 34 in other memory cells belonging to the same column as the abovementioned memory cell MC also turn on. However, the word line WL1 connected to the gate of the selection transistor 32 in the abovementioned memory cell MC, and the word lines WL1 and WL2 corresponding to columns other than the column to which the abovementioned memory cell MC belongs are applied a low level voltage.

Subsequently, the bit lines BL2 and BL3 connected to the memory cell MC which performs the write operation are selected by the bit line selection circuits 120a, 120b. The writing circuits 130a, 130b pass, from one of the bit line selection circuits 120a, 120b to the other, a write current through the selected bit lines BL2 and BL3. The magnetization direction of the first magnetic layer 22 (see FIG. 1) in the magnetoresistive element 20 may be made switchable by the write current thus becoming possible to perform the write operation. Incidentally, if the write current is passed from the other of the bit line selection circuits 120a, 120b to the first one of the bit line selection circuits 120a, 120b, the magnetization direction of the first magnetic layer 22 (see FIG. 1) in the magnetoresistive element 20 may be made switchable in a direction opposite to the one in the above described case, and it is possible to perform the write operation.

(Reading Operation)

Next, the operation of reading from the memory cell is described. First, a high level voltage is applied to the word line WL1 connected to the memory cell MC performing the read operation, thereby turning on the selection transistor 32 in the memory cell MC performing the read operation. At this time, the selection transistors 32 in other memory cells belonging to the same column as the memory cell MC performing the read operation also turn on. However, the word line WL1 connected to the gate of the selection transistor 34 in the memory cell MC performing the read operation, and the word lines WL1 and WL2 corresponding to columns other than the column to which the memory cell MC performing the read operation belongs are applied a low level voltage.

Subsequently, the bit lines BL1 and BL3 connected to the memory cell MC performing the read operation are selected by the bit line selection circuits 120a, 120b. The reading circuits 140a, 140b pass, from one of the bit line selection circuits 120a, 120b to the other, a read current through the selected bit lines BL1 and BL3. At this time, for example, due to the voltage between the selected bit line BL1 and BL3 being detected by the reading circuits 140a, 140b, it is possible to detect whether the magnetization directions between the first magnetic layer 22 and the second magnetic layer 26 (see FIG. 1) of the magnetoresistive element 20 are parallel (the same directions) or antiparallel (opposite directions) with each other, thereby the read operation can be performed.

Similarly to the first embodiment, the ninth embodiment can also provide a magnetic memory capable of performing the write operation with low current.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the sprit of the inventions. The accompanying claims and their equivalents are intended to cover such forms or modifications as would fail within the scope and sprit of the invention.

The invention claimed is:
1. A magnetic memory comprising:
a first terminal, a second terminal, and a third terminal;

a first magnetoresistive element including a first magnetic layer, a second magnetic layer electrically connected to the first terminal, and a first nonmagnetic layer between the first magnetic layer and the second magnetic layer;

a second nonmagnetic layer including a first portion, a second portion, and a third portion, the first portion being located between the second portion and the third portion, the second portion being electrically connected to the second terminal, the third portion being electrically connected to the third terminal, the first magnetic layer being disposed between the first portion and the first nonmagnetic layer, the second nonmagnetic layer being conductive, and the second nonmagnetic layer further including boride including B and at least one element of Hf, Al, Mg, or Ti; and a third nonmagnetic layer including a fourth portion, a fifth portion, and a sixth portion, the fourth portion being located between the fifth portion and the sixth portion, the fourth portion being located between the first portion and the first magnetic layer, the fifth portion including a first region that extends along a direction from the first portion to the second portion, the sixth portion including a second region that extends along a direction from the first portion to the third portion, and the second nonmagnetic layer including oxide of an element included in the third nonmagnetic layer.

2. The magnetic memory according to claim 1, wherein the fifth portion includes a part, a thickness of which decreases along a direction from the fourth portion to the fifth portion, and the sixth portion includes a part, a thickness of which decreases along a direction from the fourth portion to the sixth portion.

3. The magnetic memory according to claim 2, wherein the second portion includes a part, a thickness of which decreases along the direction from the first portion to the second portion, and the third portion includes a part, a thickness of which decreases along the direction from the first portion to the third portion.

4. The magnetic memory according to claim 1, wherein the first magnetic layer is in contact with the third nonmagnetic layer.

5. The magnetic memory according to claim 1, further comprising a write circuit electrically connected to the second terminal and the third terminal.

6. The magnetic memory according to claim 5, further comprising a read circuit electrically connected to the first terminal and the second terminal.

7. The magnetic memory according to claim 1, wherein the third nonmagnetic layer includes Ta or W.

8. The magnetic memory according to claim 1, wherein the third nonmagnetic layer includes β-Ta or β-W.

9. The magnetic memory according to claim 1, wherein the second nonmagnetic layer has a resistivity of not less than 1000 μΩcm.

10. The magnetic memory according to claim 1, further comprising:

a first wiring, a second wiring, a third wiring, and a fourth wiring;

a fifth wiring electrically connected to the second terminal;

a first transistor including a first source, a first drain, and a first gate, one of the first source and the first drain being electrically connected to the second magnetic layer, another one of the first source and the first drain being electrically connected to the third wiring, and the first gate being electrically connected to the first wiring; and a second transistor including a second source, a second drain, and a second gate, one of the second source and the second drain being electrically connected to the third terminal, another one of the second source and the second drain being electrically connected to the fourth wiring, and the second gate being electrically connected to the second wiring.

11. The magnetic memory according to claim 1, further comprising a seventh portion included in the second nonmagnetic layer and located between the first portion and the second portion, and a second magnetoresistive element including a third magnetic layer, a fourth magnetic layer, and a fourth nonmagnetic layer disposed between the third magnetic layer and the fourth magnetic layer, the third magnetic layer being disposed between the seventh portion and the fourth nonmagnetic layer.

12. A magnetic memory comprising:

a first terminal, a second terminal, and a third terminal;

a first magnetoresistive element including a first magnetic layer, a second magnetic layer electrically connected to the first terminal, and a first nonmagnetic layer between the first magnetic layer and the second magnetic layer;

a second nonmagnetic layer including a first portion, a second portion, and a third portion, the first portion being located between the second portion and the third portion, the second portion being electrically connected to the second terminal, the third portion being electrically connected to the third terminal, the first magnetic layer being disposed between the first portion and the first nonmagnetic layer, and the second nonmagnetic layer being conductive;

a third nonmagnetic layer including a fourth portion, a fifth portion, and a sixth portion, the fourth portion being located between the fifth portion and the sixth portion, the fourth portion being located between the first portion and the first magnetic layer, the fifth portion including a first region that extends along a direction from the first portion to the second portion, the sixth portion including a second region that extends along a direction from the first portion to the third portion, and the second nonmagnetic layer including oxide or nitride of an element included in the third nonmagnetic layer; and a fourth nonmagnetic layer disposed between the first magnetic layer and the third nonmagnetic layer, the fourth nonmagnetic layer having an electrical conductivity lower than that of the third nonmagnetic layer.

13. A magnetic memory comprising:

a magnetoresistive element including a first magnetic layer, a second magnetic layer, and a first nonmagnetic layer disposed between the first magnetic layer and the second magnetic layer; and a conductive nonmagnetic member including a first portion, a second portion, and a third portion, the first portion being located between the second portion and the third portion, the first magnetic layer being disposed between the first portion and the first nonmagnetic layer, the first portion including a second nonmagnetic layer and a third nonmagnetic layer disposed between the second nonmagnetic layer and the first magnetic layer, the second nonmagnetic layer including oxide of an element included in the third nonmagnetic layer, and the second nonmagnetic layer further including boride including B and at least one element of Hf, Al, Mg, or Ti.

14. The magnetic memory according to claim 13, wherein the second portion and the third portion include nonmagnetic material having an electrical conductivity higher than that of the third nonmagnetic layer.

15. The magnetic memory according to claim 13, wherein the first magnetic layer is in contact with the third nonmagnetic layer.

16. The magnetic memory according to claim 13, further comprising:
    a first terminal electrically connected to the second magnetic layer,
    a second terminal electrically connected to the second portion,
    a third terminal electrically connected to the third portion, and
    a write circuit electrically connected to the second and third terminals.

17. The magnetic memory according to claim 16, further comprising a read circuit electrically connected to the first terminal and the second terminal.

18. The magnetic memory according to claim 13, wherein the third nonmagnetic layer includes Ta or W.

19. The magnetic memory according to claim 13, wherein the third nonmagnetic layer includes β-Ta or β-W.

20. The magnetic memory according to claim 13, wherein the second nonmagnetic layer has a resistivity of not less than 1000 μΩcm.

21. The magnetic memory according to claim 13, further comprising:
    a first wiring, a second wiring, a third wiring, and a fourth wiring;
    a fifth wiring electrically connected to the second terminal;
    a first transistor including a first source, a first drain, and a first gate, one of the first source and the first drain being electrically connected to the second magnetic layer, another one of the first source and the first drain being electrically connected to the third wiring, and the first gate being electrically connected to the first wiring; and
    a second transistor including a second source, a second drain, and a second gate, one of the second source and the second drain being electrically connected to the third terminal, another one of the second source and the second drain being electrically connected to the fourth wiring, and the second gate being electrically connected to the second wiring.

22. The memory according to claim 13, wherein the second portion and the third portion include nonmagnetic material having an electrical conductivity higher than that of the second nonmagnetic layer.

23. A magnetic memory comprising:
    a magnetoresistive element including a first magnetic layer, a second magnetic layer, and a first nonmagnetic layer disposed between the first magnetic layer and the second magnetic layer;
    a conductive nonmagnetic member including a first portion, a second portion, and a third portion, the first portion being located between the second portion and the third portion, the first magnetic layer being disposed between the first portion and the first nonmagnetic layer, the first portion including a second nonmagnetic layer and a third nonmagnetic layer disposed between the second nonmagnetic layer and the first magnetic layer, and the second nonmagnetic layer including oxide or nitride of an element included in the third nonmagnetic layer; and
    a fourth nonmagnetic layer disposed between the first magnetic layer and the third nonmagnetic layer.

24. The magnetic memory according to claim 23, wherein the second nonmagnetic layer further includes boride including B and at least one element of Hf, Al, Mg, or Ti.

25. The memory according to claim 23, wherein
    the second portion and the third portion include nonmagnetic material having an electrical conductivity higher than that of the second nonmagnetic layer, and
    the fourth nonmagnetic layer has an electrical conductivity lower than that of the third nonmagnetic layer.

* * * * *